(12) United States Patent
Mahler et al.

(10) Patent No.: US 9,349,680 B2
(45) Date of Patent: May 24, 2016

(54) CHIP ARRANGEMENT AND METHOD OF MANUFACTURING THE SAME

(71) Applicant: Infineon Technologies Austria AG, Villach (AT)

(72) Inventors: Joachim Mahler, Regensburg (DE); Peter Strobel, Regensburg (DE); Edward Fuergut, Dasing (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 14/147,547

(22) Filed: Jan. 5, 2014

(65) Prior Publication Data

US 2015/0194377 A1    Jul. 9, 2015

(51) Int. Cl.
*H01L 23/495* (2006.01)
*H01L 23/00* (2006.01)
*H01L 23/31* (2006.01)
*H01L 23/538* (2006.01)
*H01L 21/56* (2006.01)

(52) U.S. Cl.
CPC ........ *H01L 23/49586* (2013.01); *H01L 23/315* (2013.01); *H01L 23/3121* (2013.01); *H01L 23/4951* (2013.01); *H01L 23/49513* (2013.01); *H01L 24/24* (2013.01); *H01L 24/29* (2013.01); *H01L 24/82* (2013.01); *H01L 24/97* (2013.01); *H01L 21/561* (2013.01); *H01L 23/5389* (2013.01); *H01L 2224/24137* (2013.01); *H01L 2224/2919* (2013.01); *H01L 2224/2957* (2013.01); *H01L 2224/32245* (2013.01); *H01L 2224/73267* (2013.01); *H01L 2224/92244* (2013.01); *H01L 2224/97* (2013.01); *H01L 2924/12042* (2013.01); *H01L 2924/1426* (2013.01); *H01L 2924/1431* (2013.01); *H01L 2924/1434* (2013.01)

(58) Field of Classification Search
CPC ..................... H01L 24/01; H01L 2224/04105
See application file for complete search history.

(56) References Cited

U.S. PATENT DOCUMENTS

| | | | |
|---|---|---|---|
| 7,321,164 B2 | 1/2008 | Hsu | |
| 7,847,375 B2 | 12/2010 | Mahler | |
| 7,868,465 B2 | 1/2011 | Otremba | |
| 2008/0315438 A1 | 12/2008 | Mahler | |
| 2010/0148381 A1 | 6/2010 | Mahler | |
| 2013/0175702 A1* | 7/2013 | Choi | H01L 23/3128 257/774 |
| 2013/0256912 A1 | 10/2013 | Prueckl | |

FOREIGN PATENT DOCUMENTS

DE    102010000400 A1    8/2010
DE    102008025451 B4    4/2011

* cited by examiner

*Primary Examiner* — Elias M Ullah

(57) ABSTRACT

A chip arrangement is provided which comprises a carrier; and at least two chips arranged over the carrier; wherein a continuous insulating layer is arranged between the at least two chips and between the carrier and at least one of the at least two chips.

19 Claims, 3 Drawing Sheets

CHIP ARRANGEMENT AND METHOD OF MANUFACTURING THE SAME

TECHNICAL FIELD

Various embodiments relate to a chip arrangement and to a method of manufacturing a chip arrangement.

BACKGROUND

Methods of manufacturing chip arrangements, in particular multi-chip arrangements, are well known in the art. In the case of multi-chip arrangements, a plurality of chips is typically arranged side-by-side or chip-by-chip and contacted by contact lines, conductors, bonding wires or the like. In such multi-chip arrangements the electrical insulation between the single chips is very important in order to maintain the operation of the chip arrangement. Therefore, a method of manufacturing a multi-chip arrangement providing sufficient insulating between the different chips is needed.

SUMMARY

Various embodiments provide a chip arrangement comprising a carrier; and at least two chips arranged over the carrier; wherein a continuous insulating layer is arranged between the at least two chips and between the carrier and at least one of the at least two chips.

Furthermore, various embodiments provide a chip arrangement comprising a carrier; a first chip arranged on the carrier; and a second chip arranged on a continuous insulating layer and beside the first chip, wherein the continuous insulating layer is arranged on the first chip.

Moreover, various embodiments provide a method for manufacturing a chip arrangement, the method comprising arranging a first chip on a carrier; arranging a second chip on a continuous insulating layer; and arranging the continuous insulating layer on the first chip arranged on the carrier.

BRIEF DESCRIPTION OF THE DRAWINGS

In the drawings, like reference characters generally refer to the same parts throughout the different views. The drawings are not necessarily to scale. Instead emphasis is generally being placed upon illustrating the principles of the invention. In the following description, various embodiments are described with reference to the following drawings, in which.

DETAILED DESCRIPTION

Figure 1A:
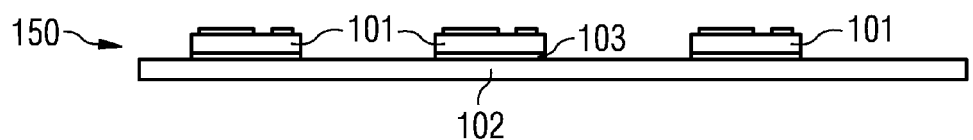
FIG. 1A to FIG. 1H show steps of a manufacturing method of a chip arrangement according to an exemplary embodiment.

In the following further exemplary embodiments of a semiconductor device and a method of manufacturing a semiconductor device will be explained. It should be noted that the description of specific features described in the context of one specific exemplary embodiment may be combined with others exemplary embodiments as well.

The word "exemplary" is used herein to mean "serving as an example, instance, or illustration". Any embodiment or design described herein as "exemplary" is not necessarily to be construed as preferred or advantageous over other embodiments or designs.

Various embodiments provide a chip arrangement and a method of manufacturing a chip arrangement comprising at least two chips arranged on a carrier or chip carrier and comprising a continuous insulating layer arranged between a first one of the at least to chips and a second one of the at least two chips.

In particular, one of the at least two chips may be a power chip and the other one may be a logic chip. In particular, the continuous insulating layer may be a dielectric foil, which may have a thickness in a range between 2 micrometer and 100 micrometer, preferably in the range between 5 micrometer and 50 micrometer. For example the continuous insulating layer may be formed by chemical vapor deposition.

It should be noted that the continuous insulating layer may be arranged or placed directly on the first chip or additional elements or layers may be arranged between the first chip and the continuous insulating layer.

In the method for manufacturing a chip arrangement the continuous insulating layer may be particularly arranged on the first chip in such a way that the continuous insulating layer is arranged between the second chip and the carrier. In particular, a plurality of first chips, e.g. at least two, may be placed or arranged on the carrier, e.g. on the carrier and/or fixed to the carrier by a solder or adhesive, and/or a plurality of second chips may be placed on the continuous insulating layer, e.g. a dielectric foil. Preferably, the plurality of first chips and/or second chips may be placed side-by-side to each other on the carrier and continuous insulating layer, respectively. It should be mentioned that the terms "first chip" and "second chip" do not necessarily mean that the first chip and the second chip are different in functionality. The terms rather relate to the fact that the first chip(s) is/are placed on the carrier, while the second chip(s) is/are placed on the continuous insulating layer. For example, the continuous insulating layer may be expandable or elastic.

The term "continuous layer" may particularly denote a layer, e.g. of an insulating material, which is formed as a single continuous homogenous layer, e.g. a single laminate layer. In a continuous layer no discontinuous change between different subsections is present. Thus, it has to be distinguished from a layer which is formed by different subsections or different sublayers, e.g. a subsection comprising an adhesive and another one comprising a prepreg, for example.

The term "over" may particularly denote, that one element or layer is arranged on one side of another element or layer but not necessarily direct on the another element or layer. That is, the term "over" does not exclude that other layers or elements are arranged between.

According to an exemplary embodiment of the chip arrangement the carrier comprises an electric conductive material.

In particular, the carrier may consist of an electric conductive material. For example, the carrier may be a lead frame or a metal carrier. Examples for materials, which may be used, are metal (e.g. copper, silver, or aluminium), conductive plastic and conductive ceramics, or the like. However, alternatively non-conductive materials may be used for the carrier, e.g. (non-conductive) plastic or (non-conductive) ceramics. Preferably the chip arranged over or on the carrier is electrically connected to the carrier.

According to an exemplary embodiment of the chip arrangement the insulating layer comprises a material which has a melting temperature of above 200° C.

In particular, the melting temperature may be above 250° C., e.g. at least 260° C. which is a temperature which is often used for soldering processes. When using an insulating material having a melting or decomposing temperature above the soldering temperature it may be possible to perform soldering steps afterwards without damaging the insulating layer.

According to an exemplary embodiment of the chip arrangement the insulating layer comprising at least one material out of the group consisting of: a thermoset material; a thermoplast material; a rubber material; and a mixture thereof.

In general, the used materials may be materials having a melting or decomposition temperature above 200° C. In particular, the thermoplast or plastomer material may be high quality material. High quality material may particularly denote a material having a melting or decomposition temperature above 200° C., in particular above 250° C., e.g. above 260° C.

According to an exemplary embodiment of the chip arrangement the continuous insulating layer is a laminate layer.

In particular, the continuous insulating layer may consist of a homogenous material. Thus, it has to be distinguished from a layer which is pieced together.

According to an exemplary embodiment the chip arrangement further comprises an encapsulation layer which is arranged over the at least two chips.

In particular, the encapsulation layer may be formed by or may comprise a mold material and/or may be formed by a further (continuous) layer, e.g. a laminate layer, which is arranged over the at least two chips and forming a part of a passivation of the chip arrangement. The encapsulation layer may have a thickness between 10 micrometer and 400 micrometer, preferably in the range between 20 micrometer and 200 micrometer.

According to an exemplary embodiment the chip arrangement further comprises interconnections extending through the encapsulation layer.

In particular, the chip arrangement may only comprise interconnections extending through the encapsulation layer. That is, the carrier may be free of any interconnections formed through the carrier.

According to an exemplary embodiment of the chip arrangement the continuous insulating layer is adapted to act as an adhesive material for the at least one of the at least two chips.

According to an exemplary embodiment of the chip arrangement the carrier has a thickness in a range between 100 micrometer and 1,000 micrometer.

In particular, the carrier may be a leadframe or a laminate layer. However, it is preferred that the carrier is not a common printed circuit board. That is, the term "carrier" may particularly denote any substantially two-dimensional element or support which is self-supporting or rigidly enough to support itself and chips arranged on the same, but is not formed by a printed circuit board.

According to an exemplary embodiment of the chip arrangement the continuous insulating layer is arranged on at least three sides of the first chip.

In particular, the continuous insulating layer is covering the first chip on at least three sides, e.g. on five sides. For example, the continuous insulating layer may cover the first chip on all sides except on the side where the first chip is arranged on the carrier.

According to an exemplary embodiment the chip arrangement further comprises an encapsulation layer.

According to an exemplary embodiment of the method for manufacturing a chip arrangement the continuous insulating layer comprising a material which is adhesive when the second chip is arranged on the continuous insulating layer.

In particular, the material may be a precured material. Examples for the precured material may be, e.g. a precured thermoset material, a precured high quality thermoplast plastomer material.

According to an exemplary embodiment the method for manufacturing a chip arrangement further comprises arranging an encapsulation layer on top of the second chip before the continuous insulating layer is arranged on the first chip.

According to an exemplary embodiment the method for manufacturing a chip arrangement further comprises arranging an encapsulation layer on top of the second chip during the arranging of the continuous insulating layer on the first chip.

In particular, the encapsulation layer may be a lamination layer or lamination sheet. According to this embodiment, the encapsulation layer and the continuous insulating layer are simultaneously arranged on the first chip and the carrier.

According to an exemplary embodiment the method for manufacturing a chip arrangement further comprises opening of the encapsulation layer after it is arranged over the carrier.

In particular, the encapsulation layer may be structured by forming vias, through holes, trenches, wells or the like, which may afterwards be filled by a metallization or by an electrically conductive material for forming conductors, for example.

According to an exemplary embodiment of the method for manufacturing a chip arrangement the opening of the encapsulation layer is performed by a laser.

Alternatively or additionally the opening may be performed by etching or any other process step suitable to provide vias or through holes extending through the encapsulation layer.

According to an exemplary embodiment of the method for manufacturing a chip arrangement a plurality of second chips is arranged on the continuous insulating layer.

For example, the arranging of the plurality of second chips may be performed simultaneously, e.g. by arranging a wafer comprising a plurality of chip, e.g. power chips and/or logic chips on the continuous insulating layer. Alternatively, the plurality of chips may be placed subsequently or separately from each other on the continuous insulating layer. After arranging the plurality of second chips on the continuous insulating layer the same may be expanded so that the second chips have a predetermined distance from each other. It should be mentioned that also a plurality of first chips may be placed on the carrier either simultaneously or subsequently.

According to an exemplary embodiment the method for manufacturing a chip arrangement further comprises a singularizing step.

By singularizing a plurality of chip arrangements may be formed each including at least two chips, e.g. at least one or two power chips and at least one logic chip. In particular, the singularizing may include an expansion process. For example, the carrier and/or the continuous insulating layer may comprise or may be formed by an expandable material which can be expanded increasing a pitch between the chips arranged side-by-side.

Summarizing a gist of an exemplary embodiment may be to provide a chip arrangement, e.g. a bridge circuit comprising at least one half bridges and at least one driving circuit, comprising a lamination or encapsulating layer on an upper major surface and a lower major surface of chips which are arranged or placed on a carrier or chip carrier and electrically connected with other chips arranged on the carrier as well. The continuous insulating layer may thus form an insulation layer between different chips arranged or fixed to the carrier and additionally as a protection or cover layer for chips already arranged on the carrier. In particular, a multi-chip arrangement may be formed.

Various of the exemplary embodiments of the chip arrangement or the method of manufacturing a chip arrangement may provide one or several of the following advantages. When using the continuous insulating layer it may not be necessary to use an additional or specific adhesive for fixing chips on the carrier. This may be in particular true when using a precured thermoset or thermoplast material. Additionally, it may be possible to provide an insulating layer having a homogenous layer thickness and thus providing homogenous isolation strength. In addition it may be possible to choose the material of the continuous insulating layer according to the needs, e.g. materials providing a high isolation strength. It may further be possible that the materials of the different layers are tailored to each other, in particular with respect to the coefficient of thermal expansion (CTE) and/or with respect to the coefficient of elasticity. Thus, it may be possible that the chip arrangements may have an improved reliability. In case also sidewalls of the chips are covered by the continuous insulating layer it may be possible that metal components of the chip, e.g. contact pads, may not react to other components or materials of the chip arrangement, e.g. forming of CuSi may be reduced. According to specific embodiments it may be possible to reduce or eliminate the usage of prepreg materials between chips or as a part of an encapsulating layer. The continuous insulating layer may also provide a complete covering of the bottom or lower side of the chips. Furthermore, the use of a continuous insulating layer may enable and simplify a parallelization of the manufacturing method.

The following detailed description refers to the accompanying drawings that show, by way of illustration, specific details and embodiments in which the invention may be practiced.

FIG. 1A shows a first step 150 of a manufacturing method of a chip arrangement, e.g. a bridge circuit, according to an exemplary embodiment. In particular, a plurality of chips 101, e.g. power-chips are arranged on a carrier 102, e.g. a lead frame or conductive carrier, and electrically connected to the same. The chips may be soldered or bonded, e.g. at a temperature above 300° C., to the carrier or fixed to the carrier by an electric conductive material 103, e.g. an electrically conductive adhesive, nanopaste or the like.

Figure 1B:
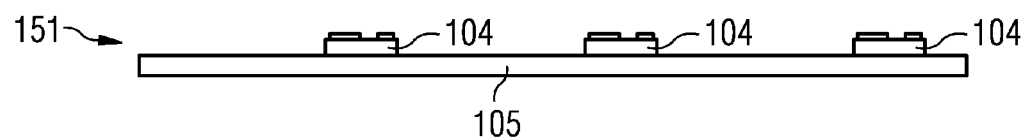

FIG. 1B shows a second step 151 of the manufacturing method. In particular, a plurality of further chips 104, e.g. logic chips, driver chips, memory chips or sensor chips, which should be insulated from the plurality of chips 101, are arranged or placed on a continuous insulating or dielectric layer 105, e.g. a laminate foil, having a thickness between 5 micrometer and 50 micrometer, in a predetermined distance or pitch. The dielectric layer 105 may comprise or may consist of a precured thermoset material or high quality thermoplast material. The dielectric layer or laminated foil 105 may be filled or unfilled and/or may be fiber glass reinforced.

Figure 1C:
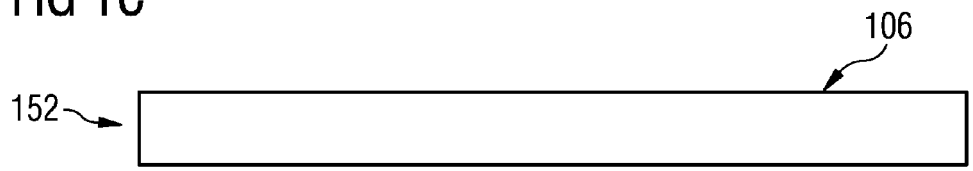

FIG. 1C shows a third step 152 of the manufacturing method. In particular, a further laminate layer or laminate sheet 106 may be provided having a thickness of about 20 micrometer to 200 micrometer and may comprise the same or a different material as the dielectric layer 105. Optionally, the laminate layer 106 may comprise a plurality of sublayers. 107.

Figure 1D:
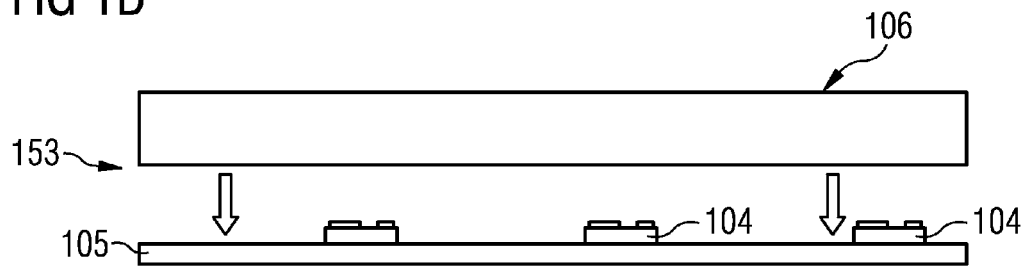

FIG. 1D shows a fourth step 153 of the manufacturing method. In particular, the further laminate layer 106 is arranged on the plurality of further chips 104 and is fixed to the dielectric layer 105 by a positive fit and/or adhesively joint under pressure, e.g. 100 kilopascal to 10,000 kilopascal, and/or increased temperature, e.g. at a temperature between 150° C. and 300° C. Thus, the plurality of further chips 104 are encapsulated on both sides.

Figure 1E:
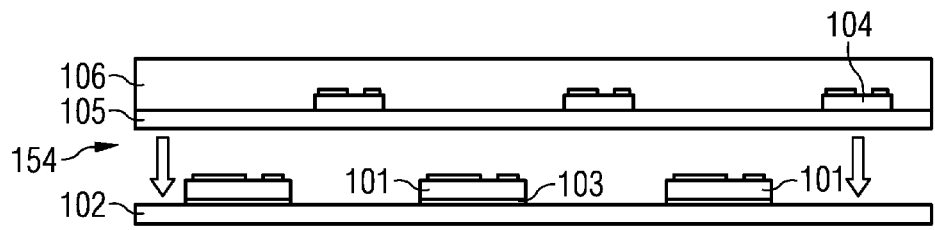
Figure 1F:
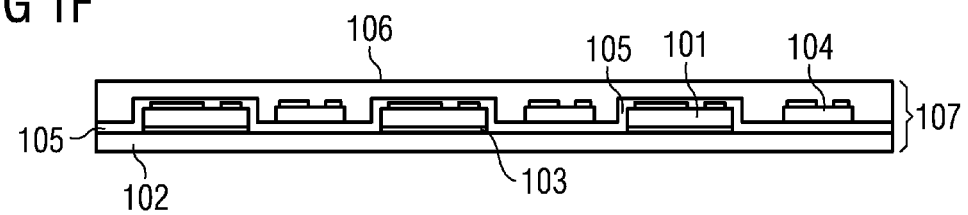

FIG. 1E shows a fifth step 154 of the manufacturing method. In particular, the multilayer structure of FIG. 1D (double side laminated chips or devices) is fixed to the carrier 101 and the plurality of chips 101 arranged thereon by a positive fit and/or adhesively joint under pressure and/or increased temperature. The result, a compound composite 107 of this fifth step is shown in FIG. 1F.

Figure 1G:
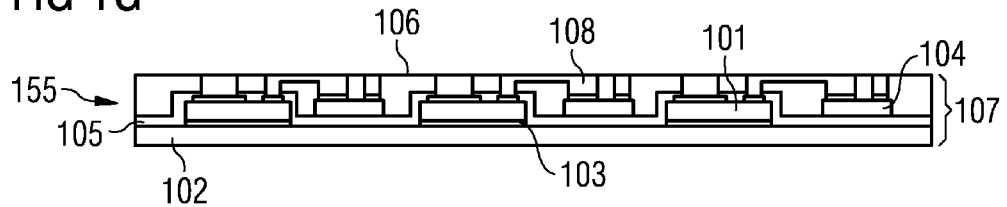

FIG. 1G shows the result of the sixth step 155 of the manufacturing method. In particular, the compound composite 107 may be processed further by common process steps, e.g. vias, through holes and/or trenches may be formed and filled afterwards by a metallization 108, forming electrical connections, interconnections and/or redistributions to the encapsulated chips.

Figure 1H:
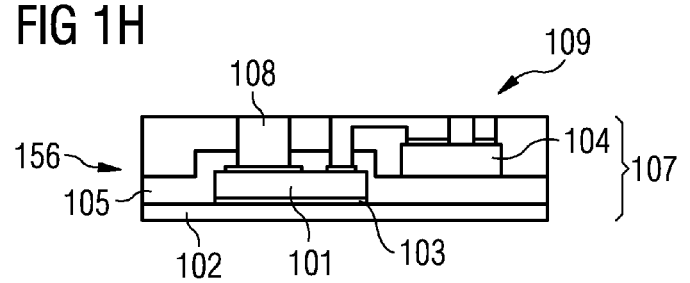

FIG. 1H shows the result of the seventh step 156 of the manufacturing method. In particular, the compound composite 107 may be separated or singularized so that a plurality of multi-chip arrangements 109 is formed. Preferably each chip arrangement may comprise at least two first chips arranged on and electrically connected to the (electrically conductive) carrier, and at least one second chip arranged between the two first chips and electrically isolated from the two first chips by the continuous insulating layer. The two first chips may form a half-bridge while the second chip may be a driver chip or comprise a driving circuit.

Figure 2:
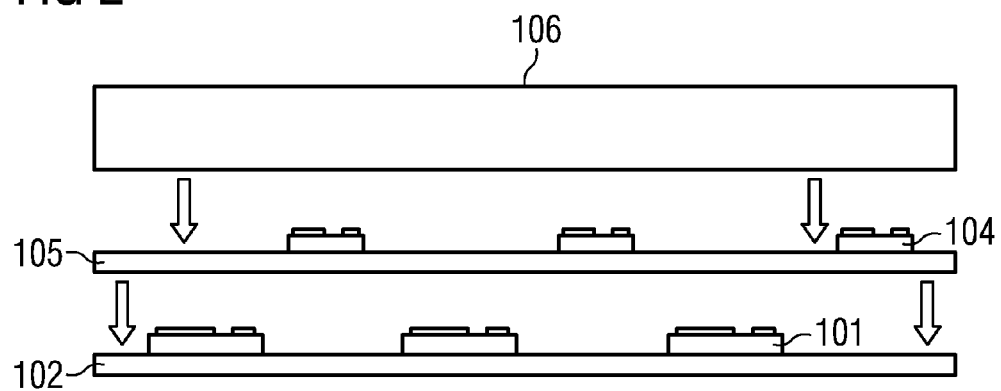
FIG. 2 shows a part of an alternative method of manufacturing method of a chip arrangement.

FIG. 2 shows a part of an alternative method of manufacturing method of a chip arrangement. In principle the alternative method may be similar to the method described in connection with FIG. 1A to FIG. 1H. However, the fourth and fifth steps 153 and 154 may be performed together. That is, the arranging of the laminate sheet 106 onto the dielectric foil 105 (having the plurality of chips 104 placed thereon) is performed simultaneously with the arranging of the dielectric foil 105 onto the carrier 102. Other manufacturing steps may correspond to the exemplary embodiment described in connection with the exemplary embodiment of FIG. 1A to FIG. 1H.

It should be noted that the plurality of further chips 104 and/or the plurality of chips 101 may be placed or arranged on the dielectric foil 105 and the carrier 102, respectively, by a pick and place process, i.e. as single chips. Alternatively they may be arranged in a parallel process, e.g. in form of placing a wafer on the dielectric foil 105 or carrier 102. When using this parallel technique it may be preferred to arrange an expandable sticky lamination foil onto the wafer comprising singularized chips (e.g. singularized by expanding a so called sawing foil), i.e. performing a re-lamination step. The expandable lamination foil may then be expanded so that a predetermined pitch between the single chips is achieved. Afterwards the expanded lamination foil comprising the singularized chip may then be connected to the dielectric foil 105 and then to the carrier 102.

Figure 3:
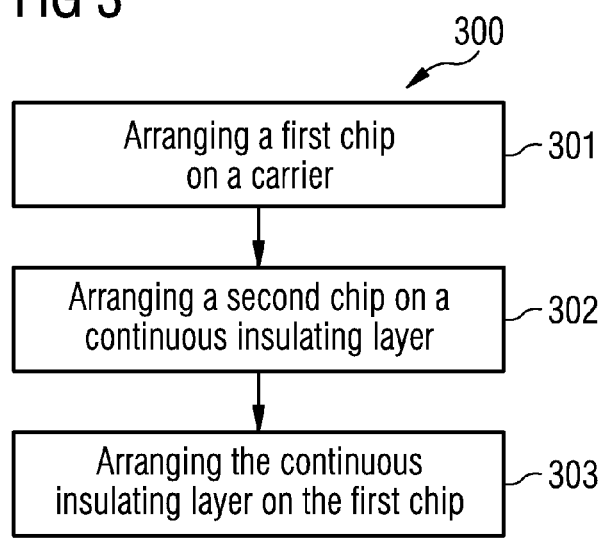
FIG. 3 shows a simplified flowchart of a method of manufacturing a chip arrangement.

FIG. 3 shows a simplified flowchart of a method of manufacturing a chip arrangement 300. In particular, the method may comprise arranging or fixing a first chip, in particular a semiconductor chip, e.g. a logic chip, power chip or a half-bridge circuit, on a carrier, e.g. a lead frame or conductive carrier 301. Additionally, the method comprises arranging a second chip, e.g. a driver circuit or driver chip or a memory chip or a sensor chip, on a continuous insulating layer 302, which is then arranged on the first chip which is already arranged on the carrier 303. Optionally the multilayer structure is processed further, e.g. by arranging an encapsulation layer onto of the second chip, forming holes and/or trenches in the encapsulation layer, forming interconnections in the holes and/or trenches, and the like. Thus, a multi-chip arrangement or device may be formed, wherein the chips are electrically isolated from each other by a continuous insulation layer arranged between the chips.

It should be noted that the term "comprising" does not exclude other elements or features and the "a" or "an" does not exclude a plurality. Also elements described in association with different embodiments may be combined. It should also be noted that reference signs shall not be construed as limiting the scope of the claims. While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A chip arrangement comprising:
   a carrier; and
   at least two chips arranged over the carrier each chip comprising a top surface, a bottom surface and a lateral sidewall extending therebetween;
   wherein a continuous insulating layer is arranged between the carrier and at least one of the at least two chips, and further vertically extends between the lateral sidewalls of the at least two chips.

2. The chip arrangement according to claim 1, wherein the carrier comprises an electric conductive material.

3. The chip arrangement according to claim 1, wherein the insulating layer comprises a material which has a melting temperature of above 200° C.

4. The chip arrangement according to claim 1, wherein the insulating layer comprising at least one material out of the group consisting of:
   a thermoset material,
   a thermoplast material;
   a rubber material; and
   a mixture thereof.

5. The chip arrangement according to claim 1,
   wherein the continuous insulating layer is a laminate layer.

6. The chip arrangement according to claim 1, further comprising an encapsulation layer which is arranged over the at least two chips.

7. The chip arrangement according to claim 6, further comprising interconnections extending through the encapsulation layer.

8. The chip arrangement according to claim 1, wherein the continuous insulating layer is adapted to act as an adhesive material for the at least one of the at least two chips.

9. The chip arrangement according to claim 1,
   wherein the carrier has a thickness in a range between 100 micrometer and 1,000 micrometer.

10. A chip arrangement comprising:
    a carrier;
    a first chip arranged on the carrier;
    a second chip arranged on a continuous insulating layer and beside the first chip, wherein the continuous insulating layer is arranged over the first chip.

11. The chip arrangement according to claim 10,
    wherein the continuous insulating layer is arranged on at least three sides of the first chip.

12. The chip arrangement according to claim 10, further comprising an encapsulation layer.

13. Method of manufacturing a chip arrangement, the method comprising:
    arranging a first chip on a carrier;
    arranging a second chip on a continuous insulating layer; and
    subsequently arranging the continuous insulating layer on the first chip arranged on the carrier;
    wherein a plurality of second chips is arranged on the continuous insulating layer.

14. The method according to claim 13,
    wherein the continuous insulating layer comprising a material which is adhesive when the second chip is arranged on the continuous insulating layer.

15. The method according to claim 13, further comprising:
    arranging an encapsulation layer on top of the second chip before the continuous insulating layer is arranged on the first chip arranged on the carrier.

16. The method according to claim 13, further comprising:
    arranging an encapsulation layer on top of the second chip during the arranging of the continuous insulating layer on the first chip arranged on the carrier.

17. The method according to claim 15, further comprising opening of the encapsulation layer after it is arranged over the carrier.

18. The method according to claim 17, wherein the opening of the encapsulation layer is performed by a laser.

19. The method according to claim 13, further comprising a singularization step.

* * * * *